US009318717B1

(12) United States Patent
Afzali-Ardakani et al.

(10) Patent No.: US 9,318,717 B1
(45) Date of Patent: Apr. 19, 2016

(54) SEMI-CONDUCTOR DEVICE WITH PROGRAMMABLE RESPONSE

(71) Applicant: International Business Machines Corporation, Armonk, NY (US)

(72) Inventors: Ali Afzali-Ardakani, Ossining, NY (US); Tze-chiang Chen, Yorktown Heights, NY (US); Kailash Gopalakrishnan, New York, NY (US); Bahman Hekmatshoartabari, White Plains, NY (US); Young H. Kwark, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/588,997

(22) Filed: Jan. 5, 2015

(51) Int. Cl.
| G11C 11/36 | (2006.01) |
| H01L 51/05 | (2006.01) |
| H01L 51/10 | (2006.01) |
| G11C 11/40 | (2006.01) |
| G11C 13/00 | (2006.01) |
| H01L 51/00 | (2006.01) |

(52) U.S. Cl.
CPC ............ *H01L 51/0562* (2013.01); *G11C 11/36* (2013.01); *G11C 11/40* (2013.01); *G11C 13/0014* (2013.01); *H01L 51/0587* (2013.01); *H01L 51/107* (2013.01); *H01L 51/005* (2013.01); *H01L 51/0055* (2013.01); *H01L 2251/301* (2013.01)

(58) Field of Classification Search
CPC ............ G11C 11/404; G11C 14/0018; G11C 2211/4016
See application file for complete search history.

(56) References Cited

U.S. PATENT DOCUMENTS

| 6,950,331 | B2 | 9/2005 | Yang et al. | |
| 7,355,238 | B2 | 4/2008 | Takata et al. | |
| 7,382,017 | B2 | 6/2008 | Duan et al. | |
| 7,544,966 | B2 | 6/2009 | Yang et al. | |
| 8,089,115 | B2 | 1/2012 | Leong et al. | |
| 8,232,544 | B2 | 7/2012 | Colli | |
| 8,654,592 | B2* | 2/2014 | El-Kareh | H01L 21/28273 365/185.02 |
| 2007/0147126 | A1* | 6/2007 | Forbes | H01L 29/66825 365/185.18 |
| 2013/0015517 | A1* | 1/2013 | Widjaja | G11C 11/404 257/316 |

OTHER PUBLICATIONS

Bichler, et al., "Functional Model of a Nanoparticle Organic Memory Transistor for Use as a Spiking Synapse", IEEE Transactions on Electron Devices, vol. 57, No. 11, Nov. 2010, pp. 3115-3122, © 2010 IEEE.
Kim, et al., "Electrical memory devices based on inorganic/organic nanocomposites", NPG Asia Materials (2012) 4, © 2012 Nature Japan K.K. All rights reserved 1884-4057/12.
(Continued)

*Primary Examiner* — Tuan T Nguyen
(74) *Attorney, Agent, or Firm* — Steven F. McDaniel

(57) ABSTRACT

An apparatus with a programmable response includes a semi-conductor device with a junction formed thereon, the junction having a built-in potential, a quantum well element proximate to the junction that provides an energy well within a depletion region of the junction. The energy well comprises one or more donor energy states that support electron trapping, and/or one or more acceptor energy states that support hole trapping; thereby modulating the built-in potential of the junction. The semi-conductor device may be a diode, a bipolar diode, a transistor, or the like. A corresponding method is also disclosed herein.

20 Claims, 5 Drawing Sheets

(56) References Cited

OTHER PUBLICATIONS

Lai, et al., "An Organic/Si Nanowire Hybrid Field Configurable Transistor", Nano Letters 2008, vol. 8, No. 3, pp. 876-880, © 2008 American Chemical Society, Published on Web Feb. 12, 2008.

Liu, et al., "Memory Effect of a Polymer Thin-Film Transistor With Self-Assembled Gold Nanoparticles in the Gate Dielectric", IEEE Transactions on Nanotechnology, vol. 5, No. 4, Jul. 2006, pp. 379-384, © 2006 IEEE.

* cited by examiner

SEMI-CONDUCTOR DEVICE WITH PROGRAMMABLE RESPONSE

BACKGROUND OF THE INVENTION

The present invention relates generally to the field of semi-conductor devices, and more particularly to programmable semi-conductor devices including memory devices.

Programmable devices are used for a variety of information processing and storage applications. Typically, device footprint and power consumption are key factors in determining which applications are best served by a specific programmable technology. A programmable technology with a small footprint and low power consumption would be usable in a wide variety of applications.

SUMMARY

As disclosed herein, an apparatus with a programmable response includes a semi-conductor device with a junction formed thereon, the junction having a built-in potential, a quantum well element proximate to the junction that provides an energy well within a depletion region of the junction. The energy well comprises one or more donor energy states that support electron trapping, and/or one or more acceptor energy states that support hole trapping. The built-in potential of the junction is increased or reduced depending on the net polarity of the trapped charge. The semi-conductor device may be a diode, a bipolar diode, a transistor, or the like. A corresponding method for obtaining a programmable response is also disclosed herein that includes providing the above semiconductor device, applying a programming signal to the semi-conductor device, and detecting a response of the semi-conductor device to a read signal.

It should be noted that references throughout this specification to features, advantages, or similar language do not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features, advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following description and appended claims, or may be learned by the practice of the invention as set forth hereinafter.

DETAILED DESCRIPTION

The embodiments disclosed herein provide memory and processing capabilities with a small footprint and low power consumption and are consequently usable in a wide variety of applications. For example, neuromorphic computing is an emerging application that requires high memory density with voltages as low as 250 mV and currents as little as 10 nA. Resistive memory elements called "memristors" or "neuristors" are often used to mimic the memory function of neurons. Unfortunately, a diode (connected in series with a resistive element) is often required to use such devices properly, resulting in operating voltages and footprints above those needed for successful neuromorphic computing. The embodiments disclosed herein provide the protection of a diode without requiring the higher operating voltages and device footprints normally associated with a diode.

Figure 1A:
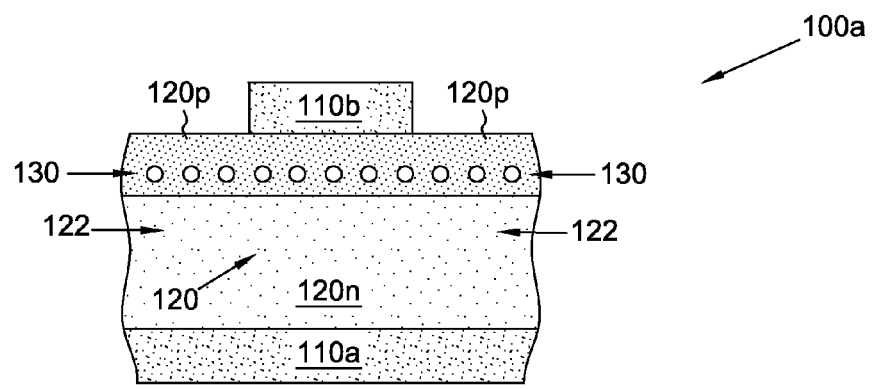
FIGS. 1a and 1b are cross-sectional illustrations depicting various embodiments of a semiconductor device with a programmable response.
Figure 1B:
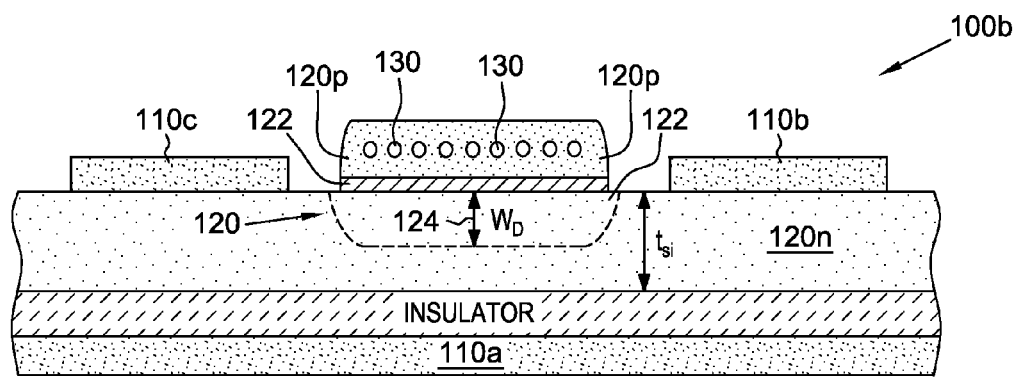

FIGS. 1a and 1b are cross-sectional illustrations depicting various embodiments of a semiconductor device 100 (e.g., 100a and 100b) with a programmable response. As depicted, the semiconductor device 100 includes one or more electrodes 110 (e.g., 110a, 110b, and 110c), a junction 120, and one or more quantum elements 130. FIG. 1a depicts a diode embodiment 100a, while FIG. 1b depicts a field effect transistor embodiment 100b. As appreciated by one skilled in the art, in the field-effect transistor embodiment of FIG. 1b, the back-gate electrode 110a may be connected to one of the two electrodes 110b or 110c to operate the device as a diode-connected transistor, i.e. analogous to the two-terminal diode device of FIG. 1a. In some embodiments, the back-gate electrode 110a may be operated independently, i.e. the field-effect transistor may be operated as a three-terminal device. The voltage bias applied to the back-gate terminal can modulate the Fermi level in the channel material 120n, thus modulating the free carrier concentration in the channel material 120n.

In some embodiments, the source and drain electrodes 110b and 110c of the field-effect transistor device of FIG. 1b are "ambipolar" contacts, i.e., capable of injecting both electrons and holes into the channel depending on the polarity of the voltage applied to the back-gate terminal. In these embodiments, the back-gate electrode can modulate the conductivity type in the channel material 120n (i.e., n-type or p-type) depending on the carrier type injected into channel as determined by the polarity of the gate voltage. As a result, both electrons and holes can be trapped into the quantum elements 130 from the channel 120n. In some embodiments, ambipolar operation is advantageous in reducing the operation voltage by facilitating the trapping of the carriers of the opposite charge instead of, or in addition to, detrapping the carriers of the same charge.

Connecting the back-gate electrode 110a to one of the two electrodes 110b and 110c of an ambipolar field-effect transistor results in a two-terminal device operating analogous to that of a bipolar diode. In some embodiments, a bipolar diode is realized by connecting two diode devices of the embodiment of FIG. 1a in parallel to each other with their opposite terminals connected to each other, i.e. the electrode 110a of the first diode device connected to the electrode 110b of the second diode device and vice versa.

The semiconductor device 100 may be formed from crystalline or amorphous inorganic semiconductor materials, organic semiconductor materials, or a combination thereof. The semiconductor device 100 provides an adjustable (i.e., programmable) response, such as a selected voltage or current response, in response to an input signal applied to the electrodes 110 (e.g., across electrodes 110a and 110b). Consequently, the semiconductor device 100 can be used in a wide variety of processing and memory applications.

The junction 120 may be formed proximate to a boundary between an 'n' region 120n and a 'p' region 120p of the semiconductor device 100. The 'n' and 'p' regions may be formed by introducing electron donating impurities within the 'n' region 120n and electron accepting impurities (or molecules) within the 'p' region 120p. In some embodiments, the p and/or n-type conductivity types may result from the presence of defects or other structural properties rather than the presence of impurities in the semiconductor materials. In some embodiments, the junction 120 may be comprised of a p-i-n junction wherein an additional intrinsic (i) region is disposed between regions having p-type and n-type conductivity. In certain embodiments, where the junction 120 is comprised of a p-i-n junction, the quantum elements 130 are contained within the i region.

In some embodiments, the junction 120 is comprised of a Schottky junction formed between a metal and a semiconductor. In these embodiments, a high workfunction metal may be used instead of a p-type semiconductor to form a junction with an n-type semiconductor; and a low workfunction metal may be used instead of an n-type semiconductor to form a junction with a p-type semiconductor. In some embodiments, an additional semiconductor layer may be disposed between the metal layer and the semiconductor layer to form a "hybrid" Schottky junction. In some embodiments, the additional semiconductor material is an organic material which is substantially free of impurities.

The proximity of the region 120n to the region 120p creates a depletion region 122 with a depletion width 124 (only shown in FIG. 1b) that is essentially depleted of free carrier charges.

The creation of the depletion region 122 is due to the formation of a built-in electric field corresponding to a built-in voltage associated with the junction 120, also known as a 'barrier potential.' As known in the art, the built-in potential may be dependent on the semiconductor materials used to create the junction 120 including the doping levels of the n-type and p-type impurities as well as the structural properties of those materials.

Applying a bias voltage to the junction 120 may increase, or reduce, the electric field across the depletion region and modulate the depletion width 124 accordingly. The bias voltage is determined by the voltage (difference) applied to the electrodes 110a and 110b.

The quantum well elements 130 are proximate to the depletion region 122, provide an energy well (see FIGS. 2a-2c) within the depletion region 122, and support charge trapping. In the depicted embodiment, the quantum well elements 130 are metal nanoparticles. In some embodiments, the quantum well elements 130 are lattice defects formed proximate to the depletion region. In some embodiments, the quantum well elements 130 are interfacial states formed proximate to the depletion region—for example at the interface between regions 120n and 120p. In other embodiments, the quantum well elements 130 are embedded semiconductor elements (e.g., quantum dots) with a lower band-gap energy than the semiconductor device 100.

The amount of charge trapping may be adjusted by applying a programming signal to the semiconductor device 100 via the electrodes 110. The amount of charge trapping may change the barrier potential of the junction, the depletion width 124, and the resistance of the semiconductor device 100 to current flow. Consequently, the response of the semiconductor device 100 may be adjusted (programmed) by a programming signal.

Figure 2A:
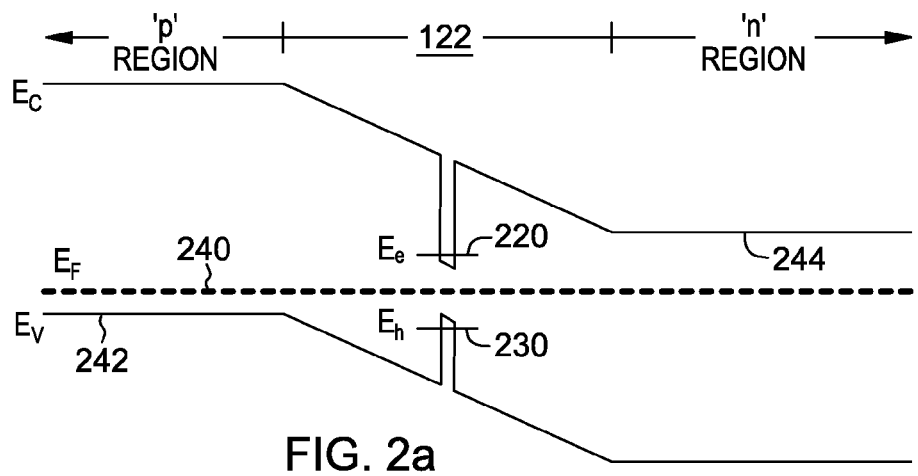
FIGS. 2a, 2b, and 2c are energy band diagrams depicting a depletion region energy well in accordance with one or more embodiments disclosed herein.
Figure 2B:
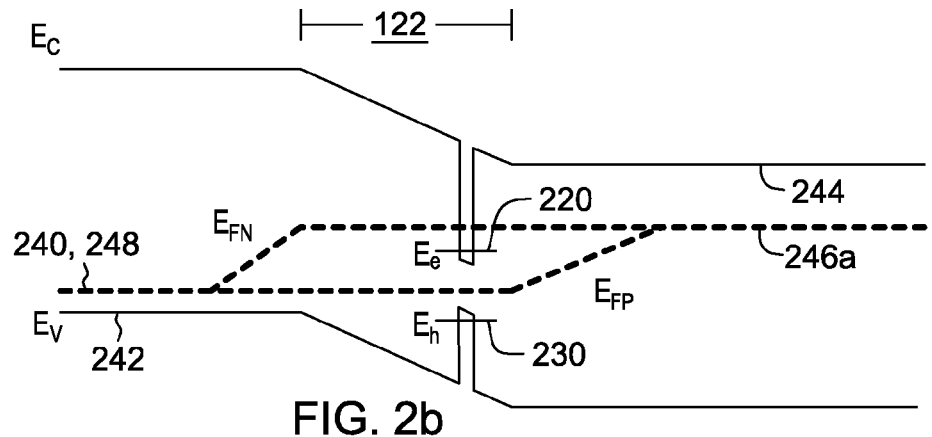
Figure 2C:
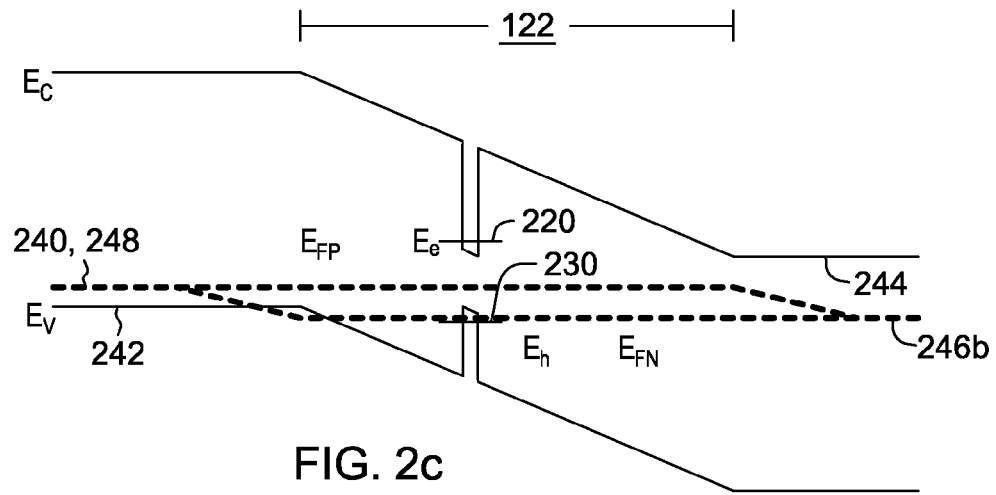

FIGS. 2a, 2b, and 2c are energy band diagrams depicting a depletion region energy well in accordance with one or more embodiments disclosed herein. The energy well may include one or more donor energy states 220 that support electron trapping and thereby increase the built-in potential of the junction, and/or one or more acceptor energy states 230 that support hole trapping and thereby decrease the built-in potential of the junction.

As shown in FIG. 2a, an equilibrium Fermi level 240 ($E_F$) for the semiconductor device 100 may reside above the highest valence band energy level 242 and below the lowest conduction band energy level 244. As shown in FIG. 2b, when a positive bias is applied, the electron quasi-Fermi level (EFN) moves up across and in the vicinity of the depletion region 122, thus reducing the width of the depletion region (e.g., the depletion width 124 in FIG. 1b). The upward movement of the electron quasi-Fermi level (EFN) results in electron trapping in the donor level $E_e$, increasing the built-in voltage of the junction accordingly. Therefore, when the bias is removed (not shown), the increased built-in voltage resulting from the trapped electrons in $E_e$ results in a depletion region width wider than that shown in FIG. 2a, but narrower than that shown in FIG. 2b.

In some embodiments, applying a positive voltage as illustrated in FIG. 2b may also result in hole trapping in $E_h$ (equivalent to electron detrapping from $E_h$). This is due to the reduction of the energy difference between $E_h$ and the quasi-Fermi level for holes, $E_{FP}$. As appreciated by one skilled in the art, unless the density of electronics states at $E_h$ is substantially higher than that at $E_e$, and/or the energy level $E_e$ is much shallower than $E_h$, the electron trapping in $E_e$ dominates electron detrapping from $E_h$. The change in the built-in potential will thus depend on the density of electrons trapped in $E_e$, minus the density of electrons detrapped from $E_h$ (or equivalently the density of holes trapped in $E_h$), which may be referred to as the "net" density of trapped electrons. In contrast, applying a negative bias as shown in FIG. 2c results in "net" electron detrapping, thus resulting in the decrease of the built-in potential and therefore a depletion region width narrower than that shown in FIG. 2a, but wider than that shown in FIG. 2c (not shown). In some embodiments, when a negative bias is applied, the detrapping of electrons from $E_e$ is facilitated via recombination with trapped holes in $E_h$, thus reducing the required bias voltage and/or the required duration of the bias.

For simplicity, a 'p' region quasi-Fermi level 248 is shown to be substantially equal to the unbiased Fermi level 240, though in practice they may be unequal. Furthermore, although the quasi-Fermi level 246a is shown to go above the donor energy state 220 in FIG. 2b and the quasi-Fermi level 246b is shown to go below the acceptor energy state 230 in FIG. 2c, it is not necessary that the (electron or hole) quasi-Fermi levels to go above the donor energy state 220 or below the acceptor energy state 230. In other words, any change in the quasi-Fermi levels (e.g., 246a and 246b) from the equilibrium Fermi level 240 may change the response of the semiconductor device 100.

The change in the (quasi) Fermi level of the semiconductor device 100 has a hysteresis effect that is dependent on the previous state of the device. Consequently, the semiconductor device 100 may be used for memory applications. In some embodiments, the trapped electrons and holes escape over time (e.g., exponentially decay) and the semiconductor device 100 may return to the original depletion width and built-in voltage. In other embodiments, the trapping of the electrons and holes is substantially permanent. Therefore, the semiconductor device 100 may function as a volatile or non-volatile memory depending on the permanence of the charge trapping. In the case of a Schottky junction, a metal layer may be used instead of the highly-doped p+ or n+ regions.

Figure 3A:
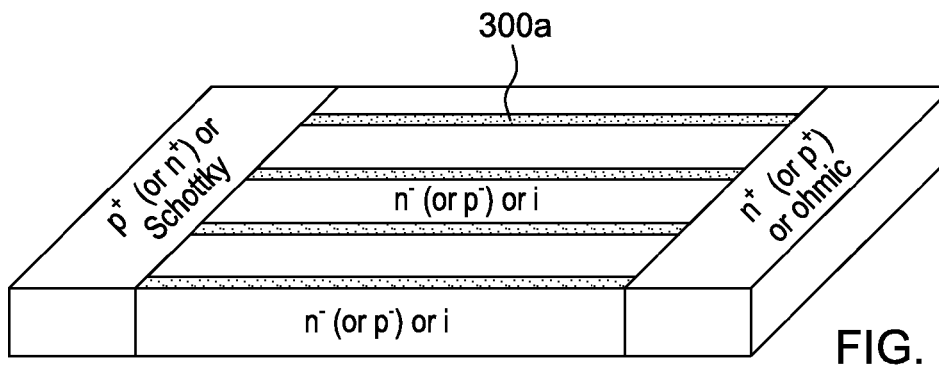
FIGS. 3a-3d are perspective view illustrations depicting various quantum well elements in accordance with one or more embodiments disclosed herein.
Figure 3B:
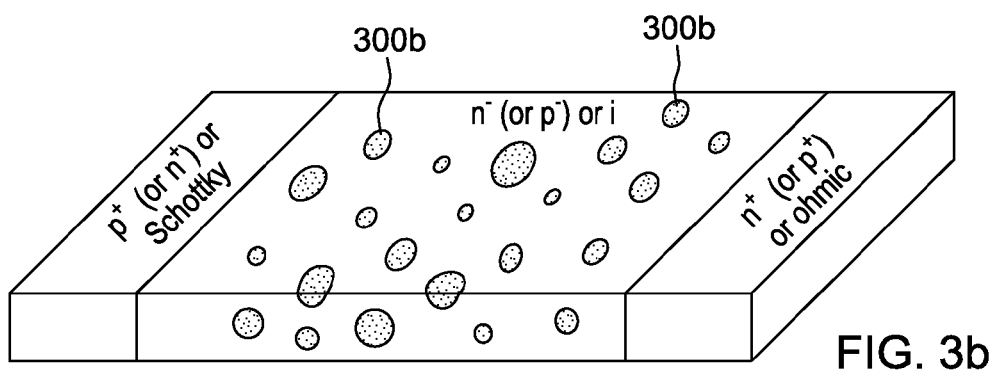
Figure 3C:
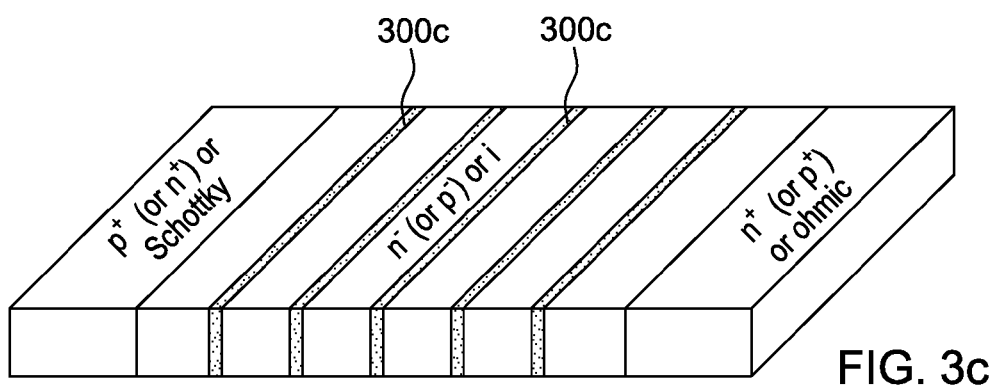
Figure 3D:
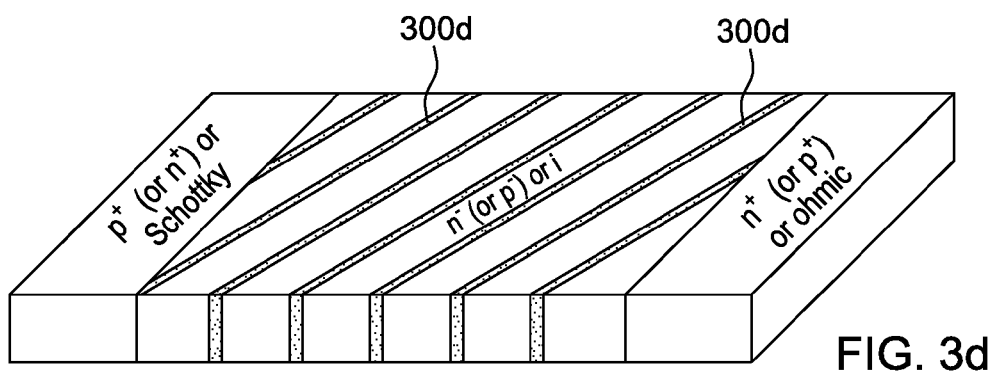

FIGS. 3a-3d are perspective view illustrations depicting various quantum well elements 300 (i.e., 300a, 300b, 300c and 300d) in accordance with one or more embodiments disclosed herein. FIG. 3a depicts parallel quantum wells 300a that are inline with current flow (preferred), FIG. 3b depicts quantum dots 300b, FIG. 3c depicts parallel quantum wells 300c that are perpendicular with current flow, and FIG. 3d depicts parallel quantum wells 300d that are slanted relative to the current flow. While FIGS. 3a to 3d show specific examples, one of skill in the art will appreciate that a wide array of quantum well elements are possible (e.g., quantum dots or metallic nanoparticles) that could be used for charge trapping in order to change the built-in potential and overall response of the semiconductor device 100.

Lattice-matched or nearly lattice-matched single-crystalline materials may be used to form the quantum well elements with respect to the channel and/or depletion region of the semiconductor device 100. Examples of lattice-matched materials systems (as known in the art, lattice mismatch may be tolerated to some extent) include $In0.53Ga0.47As/InP$, $GaAs0.51Sb0.49/InP$, $In0.53Ga0.47As/In0.52Al0.48As$, $GaAs0.51Sb0.49/In0.52Al0.48As$, $Ge/GaAs$, $Ge$ or $GaAs/In0.5Ga0.5P$ or $Al_xGa_{1-x}As$, $GaN/Al_xGa_{1-x}N$, $Si/GaN$ or $GaP$. Micro/nano-crystalline forms may be used as well. Non-crystalline materials may also be used. Examples include: a-Ge:H, a-SiGe:H, a-SiC:H, a-Ge:H, a-SiN$_x$:H, a-SiO$_x$:H or combinations thereof. Non-crystalline materials need not be lattice matched.

Figure 4A:
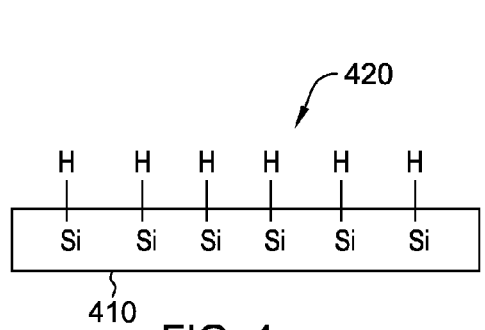
FIGS. 4a and 4b are chemical bond diagrams depicting a passivation process for an organic/inorganic hetero-junction in accordance with one or more embodiments disclosed herein.
Figure 4B:
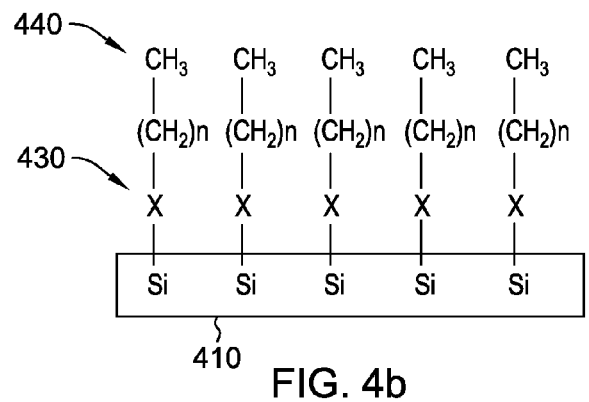

FIGS. 4a and 4b are chemical bond diagrams depicting a passivation process for an organic/inorganic hetero-junction in accordance with one or more embodiments disclosed herein. A crystalline substrate 410 may have dangling bonds 420 that are initially terminated with hydrogen, for example by dipping in a dilute hydrofluoric acid solution. A passivation layer 430 may be formed on the substrate that replaces the hydrogen atoms by an organic chain 440 to form an organic passivation layer that saturate the dangling bonds. Examples of an organic passivation layer include an aromatic organic material, a monolayer of a long-chain alcohol, and a monolayer of a long-chain thiol.

An organic material such as pentacene is disposed on the passivation layer 440 using techniques known in the art, for example by thermal evaporation, to form an organic/inorganic hetero-junction (not shown). The use of an organic/inorganic hetero-junction may eliminate the need for lattice matching and reduce the complexity of manufacturing the semiconductor device 100 while retaining the benefits associated with inorganic semiconductors such as their high mobility and good electrical stability.

Figure 5:
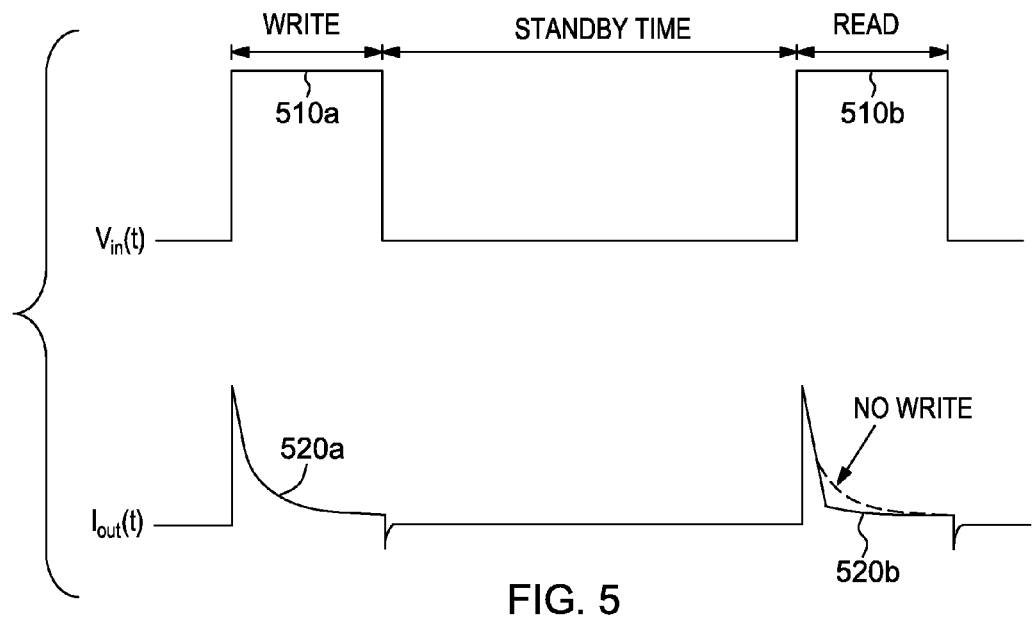
FIG. 5 is a response timing diagram in accordance with one or more embodiments disclosed herein.

FIG. 5 is a response timing diagram in accordance with one or more embodiments disclosed herein. As depicted, an initial write signal 510a may be applied to the electrodes of the semiconductor device 100 which results in a write current signal 520a and charge trapping in the semiconductor device 100. Subsequently, a read signal 510b (which could be identical to the write signal 510a) may be applied to the input of the semiconductor device 100. The read signal 510b results in a reduced current signal 520b due to the change in the built-in voltage of the semiconductor device 100 produced by the write signal 510a. One of skill in the art will appreciate that the reduced current signal 520b may be monitored to determine whether a write signal had occurred within a given time window. (The dashed line in FIG. 5 illustrates the shape of the signal 520 if no write had occurred or if the standby time were substantially longer than the retention time of the trapped charge in the quantum elements). In some embodiments, a read signal with a lower amplitude and/or shorter duration than the write signal may be used to facilitate a "non-destructive" read. A non-destructive read refers to a read operation which does not substantially change the programmed status of the device.

Figure 6:
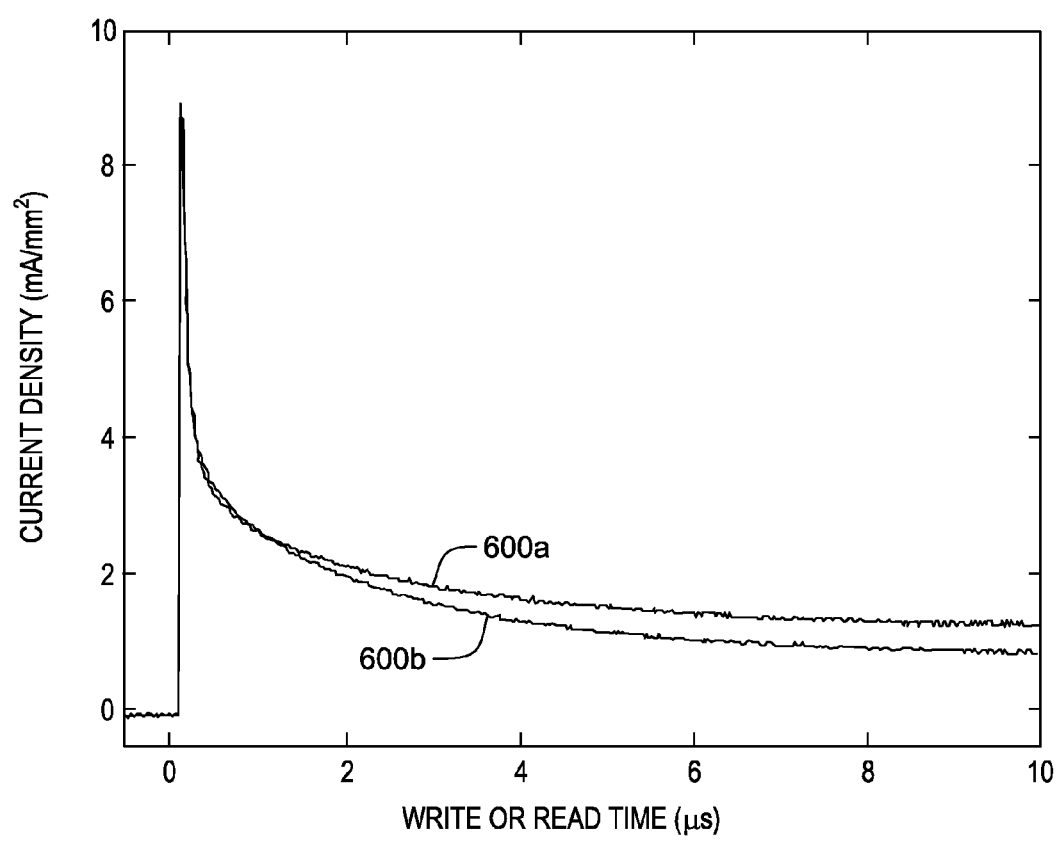
FIG. 6 is a graph depicting an example current response in accordance with one or more embodiments disclosed herein.

FIG. 6 is a graph depicting an example current response in accordance with one or more embodiments disclosed herein. The data corresponding to the example current response was generated for a prototype sample of the embodiment 100a that used Au nanoparticles as the quantum elements 130, pentacene as layer 120p and Au as a high workfunction electrode 110b. The response 600a shows the current associated with an initial write signal. In the depicted example, the write signal had an amplitude of 1V and duration of 10 µs. Electrical charge trapped in the Au nanoparticles increased the built-in voltage and reduced the diode current for a subsequent read signal that was identical to the write signal. The response 600b shows the current associated with the read signal. The read signal was applied after a standby time of 10 ms from the initial write signal.

The charge trapping features of the present invention modify the response characteristics of a semi-conductor device such as the current response or voltage response. Also, it should be noted that the apparatuses disclosed herein may be integrated with additional circuitry within integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. An apparatus with a programmable response, the apparatus comprising:
    a semi-conductor device with a junction formed thereon, the junction having a built-in potential;
    a quantum well element proximate to the junction that provides an energy well within a depletion region of the junction;
    wherein the energy well comprises one or more donor energy states that support electron trapping and/or one or more acceptor energy states that support hole trapping; and
    wherein the built-in potential of the junction corresponds to a net polarity of holes and electrons trapped by the one or more donor energy states and/or one or more acceptor energy states.

2. The apparatus of claim 1, wherein the semi-conductor device comprises a diode.

3. The apparatus of claim 2, wherein the diode is a bipolar diode.

4. The apparatus of claim 1, wherein the semi-conductor device comprises a field-effect transistor.

5. The apparatus of claim 4, wherein the field-effect transistor is ambipolar.

6. The apparatus of claim 4, wherein the semi-conductor device comprises a diode-connected transistor.

7. The apparatus of claim 1, wherein the junction is a hetero-junction.

8. The apparatus of claim 7, wherein the hetero-junction comprises an interface between a first organic material and an inorganic material.

9. The apparatus of claim 8, wherein the inorganic material comprises silicon and the first organic material comprises pentacene.

10. The apparatus of claim 9, further comprising a passivation layer between the first organic material and the inorganic material that saturates dangling bonds of the inorganic material.

11. The apparatus of claim 10, wherein the passivation layer comprises a second organic material.

12. The apparatus of claim 11, wherein the second organic material is selected from the group consisting of an aromatic organic material, a monolayer of a long-chain alcohol, and a monolayer of a long-chain thiol.

13. The apparatus of claim 1, wherein the quantum well element is a metallic nanoparticle.

14. The apparatus of claim 1, wherein the quantum well element is an embedded junction having a lower bandgap energy than the junction.

15. A method for obtaining a programmable response, the method comprising:
    providing a semi-conductor device with:
        a junction formed thereon, the junction having a built-in potential,
        a quantum well element proximate to the junction that provides an energy well within a depletion region of the junction,
        wherein the energy well comprises one or more donor energy states that support electron trapping and/or one or more acceptor energy states that support hole trapping, and
        wherein the built-in potential of the junction corresponds to a net polarity of holes and electrons trapped by the one or more donor energy states and/or one or more acceptor energy states;
    applying a programming signal to the semi-conductor device; and
    detecting a response of the semi-conductor device to a read signal.

16. The method of claim 15, wherein the semi-conductor device comprises a field-effect transistor.

17. The method of claim 16, wherein the field-effect transistor is ambipolar.

18. The method of claim 15, wherein the semi-conductor device comprises a diode-connected transistor.

19. The method of claim 15, wherein the semi-conductor device comprises a diode.

20. The method of claim 15, wherein the junction is a hetero-junction.

* * * * *